United States Patent [19]
Shiotani et al.

[11] Patent Number: 5,741,598
[45] Date of Patent: Apr. 21, 1998

[54] POLYIMIDE/METAL COMPOSITE SHEET

[75] Inventors: Akinori Shiotani; Hiroaki Yamaguchi; Fumio Aoki; Katsutoshi Washio, all of Chiba, Japan

[73] Assignee: Ube Industries, Ltd., Yamaguchi, Japan

[21] Appl. No.: 690,107

[22] Filed: Jul. 31, 1996

[30] Foreign Application Priority Data

Aug. 1, 1995 [JP] Japan .................................. 7-196537
Aug. 1, 1995 [JP] Japan .................................. 7-196538
May 31, 1996 [JP] Japan .................................. 8-138551

[51] Int. Cl.$^6$ .................................................. B32B 15/08
[52] U.S. Cl. ............................................ 428/458; 428/473.5
[58] Field of Search ................................. 428/458, 473.5

[56] References Cited

U.S. PATENT DOCUMENTS 5,262,227  11/1993  Takabayashi et al. ................. 428/215

Primary Examiner—D. S. Nakarani
Attorney, Agent, or Firm—McAulay Fisher Nissen Goldberg & Kiel, LLP

[57] ABSTRACT

A polyimide/metal composite sheet is composed of a polyimide substrate film (made of polyimide prepared by reaction of symmetric biphenyltetracarboxylic acid dianhydride and p-phenylenediamine, and optionally 4,4'-diaminodiphenyl ether), a polyimide intervening layer (made of polyimide prepared by reaction of asymmetric biphenyltetracarboxylic acid dianhydride and 1,3-bis(4-aminophenoxy)benzene), and a metal foil. The polyimide substrate film and the intervening polyimide layer are firmly combined and hardly peelable from each other, and the intervening polyimide layer and the metal foil are combined strongly by hot-melt.

6 Claims, 1 Drawing Sheet

POLYIMIDE/METAL COMPOSITE SHEET

FIELD OF THE INVENTION

The present invention relates to an aromatic polyimide/metal composite sheet, an aromatic polyimide/polyimide composite sheet, and processes for the preparation of the same.

BACKGROUND OF THE INVENTION

An aromatic polyimide sheet has a high rigidity, a high heat-resistance, and a low linear expansion coefficient, and therefore it has been employed for a wide variety of industrial devices such as electronic devices for incorporation into cameras, personal computers, and liquid crystal displays. In these devices, the polyimide sheets are generally used as substrates of flexible circuit-printing boards (for flexible electric circuits, FEC) and substrates for tape automated bonding. The polyimide substrate is used in the form of a composite of an aromatic polyimide sheet (or film) and a metal film (e.g., copper film) combined by an adhesive such as an epoxy adhesive. Most of such known adhesives are somewhat heat resistant, but less heat resistant than the aromatic polyimide. Therefore, these relatively poor heat resistant adhesives give adverse effect to the polyimide/metal composites in their heat resistance.

Therefore, there have been proposed a number of methods for preparing a heat resistant polyimide/metal composite which does not use an adhesive. For instance, a metal is electrically plated onto a polyimide film. Also known is a process comprising coating a polyamide acid solution on a metal film (or foil) and heating the coated polyamide acid layer so as to dry and imidize the coated polyamide acid. Further known is a method of pressing a thermoplastic polyimide film onto a metal foil under heating.

U.S. Pat. No. 4,543,295 discloses high temperature polyimide film laminates in which a polyimide film and a metal film are bonded by means of a polyimide adhesive. The polyimide adhesives described therein are Larc-2, -3, and -4 which are a reaction product of BTDA (3,3',4,4'-benzophenone tetracarboxylic acid dianhydride) and 3,3'-DABP (3,3'-diaminobenzophenone), a reaction product of 2 BTDA/1 PMDA (pyromellitic acid dianhydride) and 3,3'-DABP, and a reaction product of 3 BTDA/1 PMDA and 4,4'-DABP (4,4'-diaminobenzophenone), respectively.

U.S. Pat. No. 5,262,227 describes an aromatic polyimide/metal composite sheet which is produced by pressing a metal foil (or film) onto a polyimide composite sheet composed of plural polyimide films under heating.

SUMMARY OF THE INVENTION

It is a main object of the present invention to provide a new polyimide/metal composite which shows a high heat resistant and a high bonding strength between the polyimide film and the metal film.

It is another object of the invention to provide a new polyimide/metal composite which shows a high heat resistance and a high bonding strength between the polyimide film and the metal film and which can be produced under relatively mild conditions.

It is a further object of the invention to provide a new polyimide/polyimide composite which is employable for preparing a heat resistant polyimide/metal composite by combining them with heating under pressure.

There is provided by the invention a polyimide/metal composite sheet comprising a polyimide substrate film, a polyimide coat, and a metal film, wherein the polyimide substrate film comprises a polyimide having a recurring unit of the following formula (1):

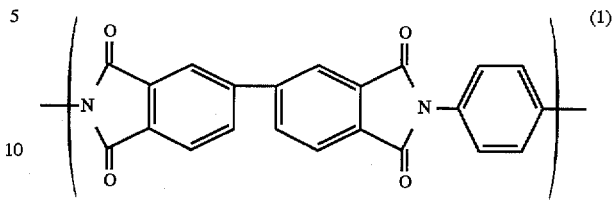

and the polyimide coat comprises a polyimide having a recurring unit of the following formula (2):

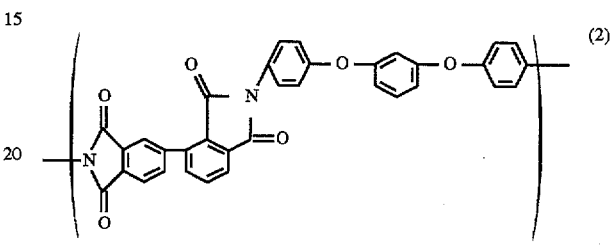

The invention also provides a polyimide/polyimide composite sheet comprising a polyimide substrate film and a polyimide coat, wherein the polyimide substrate film comprises a polyimide having a recurring unit of the above-mentioned formula (1) and the polyimide coat comprises a polyimide having a recurring unit of the above-mentioned formula (2). A metal film is pressed onto the polyimide coat by a hot melt method.

DETAILED DESCRIPTION OF THE INVENTION

Figure 1:
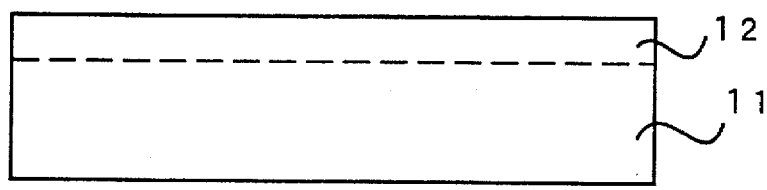
FIG. 1 is a schematic section of the polyimide/polyimide composite sheet of the invention.

As is illustrated in FIG. 1, the polyimide/polyimide composite sheet of the invention comprises a polyimide substrate film 11 and a thin polyimide coat 12 arranged on the substrate film 11. The thin polyimide coat 12 is united to the substrate film 11 so that the polyimide coat 12 cannot be separated from the substrate film 11 without its breakage.

Figure 2:
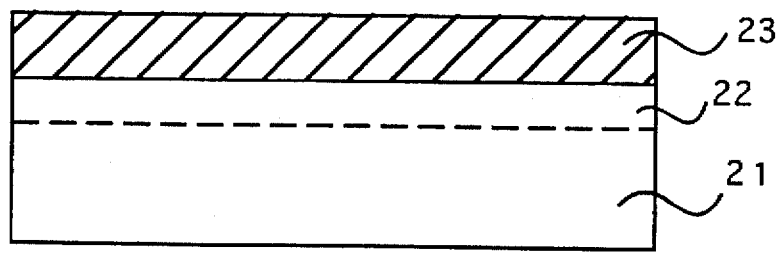
FIG. 2 is a schematic section of the metal/polyimide (or polyimide/metal) composite sheet of the invention.

As is illustrated in FIG. 2, the metal/polyimide composite sheet of the invention comprises a polyimide substrate film 21, a thin polyimide coat 22 arranged on the substrate film 21, and a metal foil 23 arranged on the polyimide coat 22. In the metal/polyimide composite sheet, the thin polyimide coat 22 is united to the substrate film 21 so that the polyimide coat 22 cannot be separated from the substrate film 21 without its breakage. The metal foil 23 is combined to the polyimide coat 22 firmly such as at a peeling strength of 1.0 kgf/cm or more (measured according to 90° peeling defined in IPC-TM-(2.4.9)).

The polyimide/polyimide composite sheet of the invention can be prepared by the following process.

The polyimide/polyimide composite sheet comprises a polyimide substrate film and a polyimide coat which is provided on the substrate film, as described above.

The polyimide of the polyimide substrate film comprises a recurring unit of the above-illustrated formula (1) and is produced from a polyamide acid (or polyamic acid) having been prepared by reaction of 3,4,3',4'-biphenyltetracarboxylic acid dianhydride (which may be referred to as "s-BPDA": "s" standing for "symmetric") and p-phenylenediamine (which may be referred to as "PPD"). The p-phenylenediamine can be employed in combination with 4,4'-diaminodiphenyl ether (which may be referred to as "DADE") under the condition that the molar ratio of PPD/DADE is in the range of 100/0 to 70/30. The polyamide acid of s-BPDA and PPD/DADE can be prepared from s-BPDA and a mixture of PPD and DADE. Otherwise, a polyamide acid of s-BPDA/PPD and a polyamide acid of s-BPDA/DADE are independently prepared and then both polyamide acids are combined.

The polyimide substrate prepared from the above-mentioned polyamide acid shows a high heat resistance, no noticeable glass transition point, a high mechanical strength, and an excellent electrical property.

The reaction for the preparation of the polyamide acid can be performed by reacting s-BPDA and PPD (or PPD/DADE) in an essentially equimolar amount in an appropriate organic solvent. A portion (up to 40 molar %) of s-BPDA can be replaced with other aromatic tetracarboxylic acid or its derivative (e.g., pyromellitic acid dianhydride) under the condition that such replacement does not essentially lower the characteristics of the resulting polyimide. Also, a portion (up to 40 molar %) of PPD (or PPD/DADE) can be replaced with other aromatic amine (e.g., 4,4'-diaminodiphenylmethane) under the condition that such replacement does not essentially lower the characteristics of the resulting polyimide.

The polyimide of the polyimide coat comprises a recurring unit of the formula (2) and is produced from a polyamide acid (or polyamic acid) having been prepared by reaction of 2,3,3',4'-biphenyltetracarboxylic acid dianhydride (which may be referred to as "a-BPDA": "a" standing for "asymmetric") and 1,3-bis(4-aminophenoxy)benzene (which may be referred to as "TPE-R").

The polyimide substrate prepared from the above-mentioned polyamide acid shows a glass transition point at a high temperature generally in the range of 200° to 300° C., high heat resistance, a high mechanical strength, and an excellent electrical property.

The reaction for the preparation of the polyamide acid can be performed by reacting a-BPDA and TPE-R in an essentially equimolar amount in an appropriate organic solvent. A portion (up to 20 molar %, preferably up to 10 molar %) of a-BPDA can be replaced with other aromatic tetracarboxylic acids or their derivatives (e.g., pyromellitic acid dianhydride, 3,3',4,4'-benzophenonetetracarboxylic acid dianhydride, 3,3',4,4'-biphenyltetracarboxylic acid dianhydride, 2,2-bis(3,4-dicarboxyphenyl)propane dianhydride, bis(3,4-dicarboxyphenyl)ether dianhydride, bis(3,4-dicarboxyphenyl)sulfone dianhydride, 2,3,6,7-naphthalenetetracarboxylic acid dianhydride) under the condition that such replacement does not essentially lower the characteristics of the resulting polyimide. Also, a portion (up to 20 molar %, preferably up to 10 molar %) of TPE-R can be replaced with other aromatic amines (e.g., aromatic diamines having plural benzene rings in its molecular structure such as 4,4'-diaminodiphenyl ether, 4,4'-diaminodiphenylsulfide, 4,4'-diaminobenzophenone, 4,4'-diaminodiphenylmethane, 2,2-bis(4-aminophenyl)propane, 1,4-bis(4-aminophenoxy)benzene, 4,4'-bis(4-aminophenyl) diphenyl ether, 4,4'-bis(4-aminophenyl)diphenylsulfone, 4,4'-bis(4-aminophenyl)diphenylsulfide, 4,4'-bis(4-aminophenyl)diphenylmethane, 4,4'-(bis(4-aminophenoxy) diphenyl ether, 4,4'-bis(4-aminophenoxy)diphenylsulfone, 4,4'-bis(4-aminophenoxy)diphenylsulfide, 4,4'-bis(4-aminophenoxy)diphenylmethane, 2,2-bis[4-(4-aminophenoxy)phenyl]propane, and 2,2-bis[4-(4-aminophenoxy)phenyl]hexafluoropropane; aliphatic diamines such as 1,4-diaminobutane, 1,6-diaminohexane, 1,8-diaminooctane, 1,10-diaminodecane, and 1,12-diaminododecane; and xylylene diamine) under the condition that such replacement does not essentially lower the characteristics of the resulting polyimide.

The polyamide acid for the preparation of the polyimide coat may have a tetracarboxylic acid residue as its terminal group. Otherwise, the terminal group may be a dicarboxylic acid residue which is attached to an amine terminal group. The dicarboxylic acid residue can be introduced by using a dicarboxylic acid anhydride such as phthalic acid anhydride and its derivatives, hexahydrophathalic acid anhydride and its derivatives, and succinic acid anhydride and its derivatives. Phthalic acid anhydride is preferred.

The reaction between the diamine compound (TPE-R and, optionally, other diamines) and the aromatic tetracarboxylic acid compound (a-BPDA and, optionally, other carboxylic acids or its derivatives, and dicarboxylic acid anhydride) can be performed in an essentially equimolar amount, preferably in an molar ratio (in terms of diamine/carboxylic acid(s)) of 0.92 to 1.0, more preferably 0.98 to 1.0, most preferably 0.99 to 1.0. The dicarboxylic acid anhydride may be employed in an amount of not more than 0.05 mole, preferably 0.0001 to 0.02 mole, per 1 mole of the tetracarboxylic acid dianhydride.

Examples of the organic solvents employable for the preparation of the polyamide acids (namely, for the polyimide substrate film and polyimide coat) include N-methyl-2-pyrrolidone, N,N-dimethylformamide, N,N-dimethylacetamide, N,N-diethylacetamide, dimethylsulfoxide, hexamethylphosphoramide, N-methylcaprolactam, and cresols. The solvents can be employed singly or in combination.

The reaction solution may contain a phosphor-type stabilizer such as triphenyl phosphite or triphenyl phosphate for keeping the reaction solution from gelation.

The reaction for the preparation of the polyamide acids can be performed in the organic solvent at a temperature of not higher than approximately 100° C., preferably at a temperature of 20° to 60° C. In the resulting reaction solution, a small amount of polyimide may be produced. The resulting reaction solution containing a polyamide acid can be employed per se as a dope solution of the preparation of the polyimide substrate film or the polyimide coat.

The polyimide/polyimide composite sheet can be prepared using a dope solution for the polyimide substrate film and a dope solution for the polyimide coat.

The dope solution for the substrate film is spread on a temporary support plate such as a glass plate, a stainless sheet, or a belt of stainless sheet or other material, and heated at 100° to 200° C. to dry the spread solution or to cure partially the polyamide acid in the spread solution layer. Therefore, the heated solution layer comprises the polyamide acid alone or a mixture of the polyamide acid and the resulting polyimide, and is in the form of a self-supporting film. The film may partially be in the form of gel.

On thus prepared film, the dope solution for the preparation of polyimide coat is coated. This dope solution can be the polyamide acid solution. Otherwise, the dope solution may be a polyimide solution which is formed by heating the polyamide acid solution at 150° to 250° C. The polyimide solution also can be produced by heating the polyamide acid solution at a temperature of not higher than 150° C., specifically 15° to 50° C., in the presence of a chemical imidizing agent.

The self-supporting polyamide acid film (or a film of a mixture of polyamide acid and polyimide) for the substrate film coated with the polyamide acid solution (or a polyimide solution, or a polyamide acid-polyimide solution) was then heated to a temperature which is higher than the glass transition point (Tg) of the polyimide of the polyimide coat but is lower than the temperature at which the polyimide begins to deteriorate. The temperature preferably is in the range of 270° to 350° C. (temperature of the film surface measured by a surface thermometer). The heating is preferably continued for 1 to 60 minutes so that the imidization of the substrate film and the coated layer can be almost complete. The polyimide/polyimide composite sheet of the invention is thus obtained.

The polyimide/polyimide composite sheet of the invention can be produced by the co-extrusion process which is described in U.S. Pat. No. 5,262,227. In the co-extrusion process, the dope solutions are extruded in the form of a solution film simultaneously from dies (i.e., extruder dies) arranged in parallel, and the extruded dope solution films are combined after the dope solution films are partially or wholly dried. The combined films are then heated for completing the imidization.

The polyimide coat can be arranged on one surface of the substrate film as described above. The polyimide coat also can be arranged on the substrate film on both surface sides. Such three layer composite sheet can be produced in the manner as described in U.S. Pat. No. 5,262,227.

In the polyimide/polyimide composite sheet of the invention, the polyimide substrate film preferably has a thickness in the range of 15 to 150 μm, and the polyimide coat preferably has a thickness in the range of 2 to 10 μm. In the composite sheet, the thickness of the substrate film preferably is 70% or more.

The polyimide substrate film and the polyimide coat of the polyimide/polyimide composite sheet of the invention are combined to each other very firmly. Therefore, it is not possible to separate the polyimide coat from the polyimide substrate film without breakage of the coat film.

The metal/polyimide composite sheet, in more detail, metal/polyimide/polyimide composite sheet, of the invention can be produced by fixing a metal film (or metal foil) onto the polyimide coat of the polyimide/polyimide composite sheet by a hot melt method. The hot melt can be performed, preferably under the conditions of a temperature of 280° to 330° C., a pressure of 1 to 100 kgf/cm$^2$, and a period of 1 sec. to 30 min. For the hot melt, a heat roll can be employed.

The metal film can be made of copper, aluminum, gold, or metal alloy. Copper film such as milled copper foil or electrolytic copper foil is preferred. The metal film preferably has a thickness of 10 to 60 μm.

If the polyimide substrate film has the polyimide coat on both sides, a metal film can be fixed onto both polyimide coat.

The preferred embodiments of the present invention are is further described by the following examples.

(1) Preparation of dope solution X-1 for substrate film

In a 300 mL-volume glass vessel equipped with a stirrer, a nitrogen-gas inlet, and a refluxing condenser, 160 g of N-methyl-2-pyrrolidone was placed. The N-methyl-2-pyrrolidone was stirred, and to this was added 10.81 g (0.1000 mole) of p-phenylenediamine (PPD) in a stream of nitrogen. The resulting mixture was kept at 50° C. to give a homogeneous solution. To the solution was slowly and carefully added 29.258 g (0.09945 mole) of 3,3',4,4'-biphenyltetracarboxylic acid dianhydride (s-BPDA) without noticeable heat production. After the addition was complete, the mixture was kept at 50° C. for 3 hours to perform the reaction for formation of polyamide acid. The resulting polyamide acid solution was a viscous brown liquid showing approx. 3,000 poise at 25° C. Thus, the desired polyamide acid-dope solution X-1 for substrate film was obtained.

(2) Preparation of dope solution X-2 for substrate film

In a 300 mL-volume glass vessel equipped with a stirrer, a nitrogen-gas inlet, and a refluxing condenser, 166 g of N,N-dimethylacetamide (DMAc) was placed. The DMAc was stirred, and to this were added 9.192 g (0.08500 mole) of p-phenylenediamine (PPD) and 3.003 g (0.01500 mole) of 4,4'-diaminodiphenyl ether (DADE) in a stream of nitrogen. The resulting mixture was kept at 50° C. to give a homogeneous solution. To the solution was slowly and carefully added 29.258 g (0.09945 mole) of 3,3',4,4'-biphenyltetracarboxylic acid dianhydride (s-BPDA) without noticeable heat production. After the addition was complete, the mixture was kept at 50° C. for 3 hours to perform the reaction for formation of polyamide acid. The resulting polyamide acid solution was a viscous brown liquid showing approx. 3,000 poise at 25° C. Thus, the desired polyamide acid-dope solution X-2 for substrate film was obtained.

(3) Preparation of dope solution Y-1 for polyimide coat

In a 500 mL-volume glass vessel equipped with a stirrer, a nitrogen-gas inlet, and a refluxing condenser having fractionating column, 195 g of N-methyl-2-pyrrolidone was placed. The N-methyl-2-pyrrolidone was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution were slowly and carefully added 29.273 g (0.0995 mole) of 2,3,3',4'-biphenyltetracarboxylic acid dianhydride (a-BPDA) and 0.1481 g (0.001000 mole) of phthalic acid anhydride without noticeable heat production. After the addition was complete, the mixture was kept at 25° C. for one hour to perform the reaction for formation of polyamide acid. To the resulting polyamide acid solution was added 20 mL of toluene, and then the resulting solution was heated to 190° C. The solution was heated to that temperature for 5 hours, while distilling water produced in the solution together with toluene off. Thus, a viscous yellowish red liquid showing approx. 500 poise at 25° C., which was the desired polyimide-dope solution Y-1 for polyimide coat, was obtained.

(4) Preparation of dope solution Y-2 for polyimide coat

In a 500 mL-volume glass vessel equipped with a stirrer, a nitrogen-gas inlet, and a refluxing condenser having fractionating column, 235 g of N,N-dimethylacetamide was placed. The N,N-dimethylacetamide was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution were slowly and carefully added 29.273 g (0.0995 mole) of 2,3,3',4'-biphenyltetracarboxylic acid dianhydride (a-BPDA) and 0.1481 g (0.001000 mole) of phthalic acid anhydride without noticeable heat production. After the addition was complete, the mixture was kept at 25° C. for 5 hours to perform the reaction for formation of polyamide acid. Thus, a viscous pale yellowish brown liquid showing approx. 2,000 poise at 25° C., which was the desired polyamide acid-dope solution Y-2 for the polyimide coat, was obtained.

(5) Preparation of dope solution Y-3 for polyimide coat

In a 500 mL-volume glass vessel equipped with a stirrer, a nitrogen-gas inlet, and a refluxing condenser having fractionating column, 269 g of N,N-dimethylacetamide was placed. The N,N-dimethylacetamide was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution was slowly and carefully added 29.71 g (0.101 mole) of 2,3,3',4'-biphenyltetracarboxylic acid dianhydride (a-BPDA) without noticeable heat production. After the addition was complete, the mixture was kept at 25° C. for 4 hours to perform the reaction for formation of polyamide acid. Thus, a viscous pale clear brown liquid showing approx. 2,000 poise at 25° C., which was the desired polyamide acid-dope solution Y-3 for the polyimide coat, was obtained.

EXAMPLE 1

The dope solution X-1 was coated on a glass plate by means of an applicator, and the coated layer was dried at 120° C. for 15 minutes. On the dry layer was coated the dope solution Y-1 using an applicator. The coated dope solution was dried at 120° C. for 15 minutes. The dried coat layer film had a thickness of 6.5 µm.

The two layer film was cooled, and separated from the glass plate. The separated film was fixed within a metal frame, and heated to 200° C. for 30 minutes and then 300° C. for 30 minutes to produce a polyimide/polyimide composite sheet (total thickness: 30 µm, 25 µm for polyimide substrate film from Dope solution X-1 and 5 µm for polyimide coat from Dope solution Y-1).

On the polyimide coat of the composite sheet was placed an electrolytic copper foil (thickness: 35 µm), and the foil was pressed on the polyimide coat using a hot press (kept at 300° C.). The hot press procedure was performed at 30 kgf/cm² for 1 minute after pre-heating for 5 minutes. Thus, a composite sheet of copper foil and two layer polyimide film which showed almost no curling was obtained.

The copper/polyimide composite sheet was examined in its 90° peel (peeling) strength, 90° peel strength after the copper foil was etched out to give a 1 mm line & space pattern, and appearance and 90° peel strength after the composite sheet was immersed in a solder bath at 280° C. for one minute. The results of the examination are set forth in Table 1. The separation was observed only at the interface between the copper foil and the polyimide coat in every test.

EXAMPLES 2 TO 6

The procedures of Example 1 were repeated except for using the combination of the dope solutions set forth in Table 1, to give a copper/polyimide composite sheet. The obtained composite sheet of copper foil and two layer polyimide film showed almost no curling.

The 90° peel strength and other characteristics of the copper/polyimide composite sheet obtained as above was examined in the same manner as in Example 1. The results of the examination are set forth in Table 1. The separation was observed only at the interface between the copper foil and the polyimide coat in every test for every composite sheet.

TABLE 1

| Example No. | Dope Solutions (Tg, °C.) | | 90° Peel Strength (kgf/cm) | | | Appearance After Soldering |
|---|---|---|---|---|---|---|
| | | | Untreated | After Etching | After Soldering | |
| 1 | X-1 (*) | Y-1 (250) | 2.1 | 2.1 | 2.0 | Good |
| 2 | X-1 (*) | Y-2 (250) | 2.0 | 2.0 | 1.9 | Good |
| 3 | X-2 (*) | Y-1 (250) | 2.1 | 2.1 | 2.0 | Good |
| 4 | X-2 (*) | Y-1 (250) | 1.9 | 1.9 | 1.9 | Good |
| 5 | X-1 (*) | Y-3 (250) | 2.1 | 2.1 | 2.0 | Good |
| 6 | X-2 (*) | Y-3 (250) | 2.0 | 2.0 | 2.0 | Good |

Remark: (*): No glass transition point was observed at temperatures between room temperature (25° C.) and 350° C.

COMPARISON EXAMPLE 1

The dope solution Y-2 was coated on a commercially available aromatic polyimide film (Upilex-S, thickness 25 µm, available from Ube Industries, Ltd.) using an applicator. The coated solution was heated successively at 120° C. for 15 minutes, at 200° C. for 30 minutes, and at 300° C. for 30 minutes. The resulting coat had a thickness of 5 µm, and the obtained polyimide/polyimide composite sheet had a thickness of 30 µm.

The procedures of Example 1 were repeated except for using the above-obtained polyimide/polyimide composite sheet, to give a copper/polyimide composite sheet. The obtained composite sheet of copper foil and two layer polyimide film showed almost no curling.

The 90° peel strength of the untreated copper/polyimide composite sheet was examined in the same manner as in Example 1. The 90° C. peel strength was as low as 0.5 kgf/cm. The separation was observed at the interface between the polyimide substrate (Upilex-S) and the polyimide coat.

EXAMPLE 7

The dope solution Y-1 was coated on a glass plate by means of an applicator, and the coated layer was dried at 120° C. for 15 minutes. On the dry layer was coated the dope solution X-1 using an applicator. The coated dope solution was dried at 120° C. for 15 minutes. On the dry coated layer of the dope solution X-1 was further coated the dope solution Y-1, and the coated layer was dried at 120° C. for 15 minutes.

Thus produced three layer film (Y-1/X-1/Y-1) was cooled, and separated from the glass plate. The separated film was fixed within a metal frame, and heated to 200° C. for 30 minutes and then 300° C. for 30 minutes to produce a polyimide/polyimide/polyimide composite sheet (5 µm/25 µm/5 µm).

On each the both polyimide coats of the composite sheet was placed an electrolytic copper foil (thickness: 35 µm), and the foil was pressed on the polyimide coat using a hot press in the same manner as in Example 1. A composite sheet of copper foil/three layer polyimide film/copper foil showing almost no curling was obtained.

The 90° peel strength and other characteristics of the copper/polyimide/copper composite sheet obtained as above was examined in the same manner as in Example 1. The results of the examination are set forth in Table 2. The separation was observed only at the interface between the copper foil and the polyimide coat in every test for every composite sheet.

EXAMPLES 8 TO 12

The procedures of Example 7 were repeated except for using the combination of the dope solutions set forth in Table 2, to give a copper/polyimide/copper composite sheet. The obtained composite sheet of copper/polyimide/copper sheet showed almost no curling.

The 90° peel strength and other characteristics of the copper/polyimide composite sheet obtained as above was examined in the same manner as in Example 1. The results of the examination are set forth in Table 2. The separation was observed only at the interface between the copper foil and the polyimide coat in every test for every composite sheet.

TABLE 2

| | | 90° Peel Strength (kgf/cm) | | | Appearance |
|---|---|---|---|---|---|
| Example No. | Dope Solutions | Untreated | After Etching | After Soldering | After Soldering |
| 7 | Y-1/X-1/Y-1 | 2.1 | 2.1 | 2.0 | Good |
| 8 | Y-2/X-1/Y-2 | 2.0 | 2.0 | 1.9 | Good |
| 9 | Y-1/X-2/Y-1 | 2.1 | 2.1 | 2.0 | Good |
| 10 | Y-2/X-2/Y-2 | 1.9 | 1.9 | 1.9 | Good |
| 11 | Y-3/X-1/Y-3 | 2.1 | 2.1 | 2.0 | Good |
| 12 | Y-3/X-2/Y-3 | 2.0 | 2.0 | 2.0 | Good |

EXAMPLE 13

In the same manner as in the Preparation procedure (2), a polyamide acid solution for substrate film was prepared in DMAc from a combination of s-BPDA and PPD/DADE (85/15, molar ratio). The obtained dope solution (X-3) had a polymer concentration of 18 wt. %, and a viscosity of 1,500 poise (25° C.).

In the same manner as in the Preparation procedure (4), a polyamide acid solution for polyimide coat was prepared in DMAc from a combination of a-BPDA and TPE-R. The obtained dope solution (Y-4) had a polymer concentration of 22 wt. %, and a viscosity of 1,500 poise (25° C.).

The dope solutions were extruded using a die described in U.S. Pat. No. 5,262,227 to place a three layer laminate (Y-4/X-3/Y-4) on a plain metal support sheet. The laminate was dried using an air heated to 140° C. to give a solid composite sheet. The solid sheet was separated from the support sheet, and heated in a heating furnace at temperatures elevating gradually from 200° C. to 320° C. for removal of the solvent and imidization.

On each of both surfaces of thus produced three layer polyimide composite sheet was laminated under pressure and heating an electrolytic copper foil (thickness: 35 μm) by the method using a heat roll described in U.S. Pat. No. 5,262,227. The lamination was performed at 320° C., 24 kgf/cm (roll pressure) and 0.5 m/min. (lamination rate). Thus, a continuous copper/polyimide/copper composite sheet was produced.

The 90° peel strength and other characteristics of the copper/polyimide/copper composite sheet obtained as above was examined in the same manner as in Example 1. The results of the examination are as follows:

90° peel strength of the untreated sheet: 1.9 kgf/cm,

90° peel strength after etching: 1.9 kgf/cm,

90° peel strength after soldering: 1.9 kgf/cm, appearance after soldering: good

Independently, the three layer polyimide composite sheet produced in this example was examined in Pressure Cooker Test (120° C., 2 atom., 20 hours) in regard of elasticity, breaking strength, and elongation. The results are set forth in Table 3.

EXAMPLES 14 TO 16

A number of polyimide composite sheets were prepared using the dope solutions set forth in Table 3, varying the curing temperature as set forth in Table 3. On the surface of the prepared polyimide composite sheet was laminated a copper foil in the same manner as in Example 13. Thus produced copper/polyimide/copper composite sheet or copper/polyimide composite sheet was examined in its 90° C. peel strength in the same manner as in Example 1. The test results are set forth in Teble 3.

Independently, the three layer polyimide composite sheet or two layer polyimide composite produced was examined in Pressure Cooker Test (120° C., 2 atom., 20 hours) in regard of elasticity, breaking strength, and elongation. The results are also set forth in Table 3.

TABLE 3

| Example No. | Dope Solutions (cure temp.) | Elasticity (kgf/mm$^2$) | Breaking Strength (kgf/mm$^2$) | Elongation (%) | 90° C. peel strength (kgf/cm) |
|---|---|---|---|---|---|
| 13 | Y-4/X-3/Y-4 (320° C.) | 476/504 [507/499] | 25.5/24.6 25.7/24.7 | 39/36 [37/38] | 1.9 |
| 14 | Y-4/X-3/Y-4 (330° C.) | 527/519 [488/505] | 26.2/25.5 25.9/26.4 | 38/37 [38/39] | 2.0 |
| 15 | Y-4/X-3/Y-4 (340° C.) | 494/505 [495/495] | 26.4/26.4 26.9/27.5 | 37/37 [39/41] | 2.1 |
| 16 | Y-4/X-3 (330° C.) | 572/568 [541/558] | 29.8/29.9 27.9/29.2 | 33/34 [31/33] | 1.9 |

Remarks: The values in the bracket [ ] are those determined after the composite sheet was subjected to PCT (Pressure Cooker Test).
Value in MD direction/Value in TD direction As is clear from the above-illustrated experimental results, the metal/polyimide composite sheet of the invention has high anti-peeling strength enough for the use in various industrial fields. The polyimide coat is firmly combined to the polyimide substrate film, and it is not possible to separate the polyimide coat from the separate film without breakage of the polyimide coat.

What is claimed is:

1. A composite sheet comprising, in this order, a polyimide substrate film, a polyimide coat, and a metal film, wherein the polyimide substrate film comprises a polyimide having a recurring unit of the following formula (1):

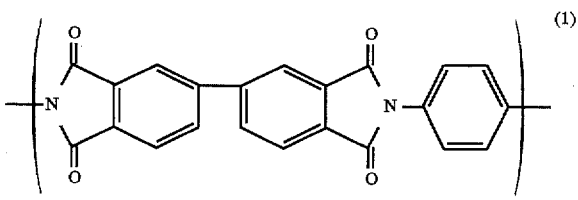

and the polyimide coat comprises a polyimide having a recurring unit of the following formula (2):

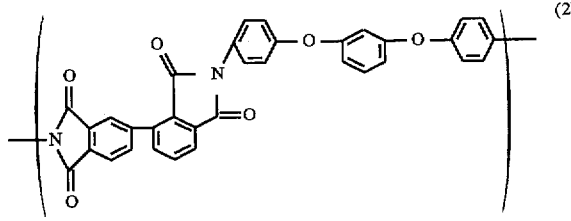

2. The composite sheet of claim 1, wherein the polyimide of the polyimide substrate film further comprises a recurring unit of the following formula (3):

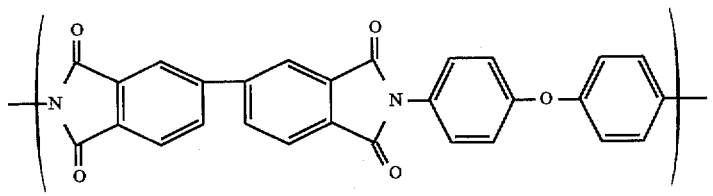

under the condition that a molar ratio of the recurring unit of the formula (3) per the recurring unit of the formula (1) is 30/70 or less.

3. The composite sheet of claim 2, wherein the polyimide overcoat is unpeelable from the polyimide substrate film without breakage of the polyimide overcoat.

4. The composite sheet of claim 2, wherein the metal film is bonded to the polyimide overcoat at a peeling strength of 1.0 kgf/cm or more, said peeling strength being measured according to 90° peeling defined in IPC-TM-(2.4.9).

5. The composite sheet of claim 1, wherein the polyimide overcoat is unpeelable from the polyimide substrate film without breakage of the polyimide overcoat.

6. The composite sheet of claim 1, wherein the metal film is bonded to the polyimide overcoat at a peeling strength of 1.0 kgf/cm or more, said peeling strength being measured according to 90° peeling defined in IPC-TM-(2.4.9).

* * * * *